United States Patent [19]

Clark

[11] Patent Number: 5,764,087
[45] Date of Patent: Jun. 9, 1998

[54] DIRECT DIGITAL TO ANALOG MICROWAVE FREQUENCY SIGNAL SIMULATOR

[75] Inventor: Charles John Clark, Annapolis, Md.

[73] Assignee: AAI Corporation, Hunt Valley, Md.

[21] Appl. No.: 474,085

[22] Filed: Jun. 7, 1995

[51] Int. Cl.$^6$ ............................................... H03B 21/00
[52] U.S. Cl. ........................ 327/105; 327/113; 327/119; 327/116; 327/107; 364/721
[58] Field of Search ........................ 327/105, 106, 327/107, 100, 113, 114, 99, 144, 145, 119; 364/721

[56] References Cited

U.S. PATENT DOCUMENTS

| | | |
|---|---|---|
| 3,906,388 | 9/1975 | Jones et al. ............................. 331/39 |
| 5,436,600 | 7/1995 | Van Heteren et al. .................. 327/105 |
| 5,495,202 | 2/1996 | Hsu ........................................ 327/105 |
| 5,521,533 | 5/1996 | Swanke .................................. 327/105 |

Primary Examiner—Timothy P. Callahan
Assistant Examiner—Dinh Le
Attorney, Agent, or Firm—Venable, Baetjer, Howard & Civiletti, LLP

[57] ABSTRACT

A direct digital-to-analog microwave frequency signal synthesizer device which employs both wideband and narrowband direct digital frequency synthesizer (DDFS) circuitry to improve frequency and phase agility, reduce spurious performance, and minimize direct analog circuitry. A clock output having an extremely precise and highly stabilized frequency is fed to the wideband DDFS circuit and to the narrowband DDFS circuit. One or the other is selectively enabled by control logic circuitry. When the former is enabled, precision, high frequency resolution, low spurious, fast frequency switching is achieved at the microwave output. When the latter is enabled, precision, high frequency and phase resolution, low spurious, is achieved, providing frequency chirp, and frequency phase control at the microwave output. The output of the wideband DDFS circuit is processed to reduce the spurious response and up-converted, while the output of the narrow band DDFS circuit is directly up-converted. The selected DDFS circuit, is frequency up-converted to provide a synthesized microwave output signal.

6 Claims, 4 Drawing Sheets

DIRECT DIGITAL TO ANALOG MICROWAVE FREQUENCY SIGNAL SIMULATOR

FIELD OF THE INVENTION

This invention relates to microwave signal synthesis, more specifically, to a method and apparatus for producing microwave signals by combining direct digital frequency synthesis (DDFS) with direct analog microwave frequency synthesis (DMFS).

BACKGROUND OF THE INVENTION

In the defense and commercial electronics industries there is an increasing demand for higher performance, more reliable, reduced size and cost microwave signal sources for such applications as radar target simulation, radar and communications design and evaluation, line and depot test and calibration and multi-source environment simulation.

Conventional direct and indirect microwave frequency synthesizers, capable of operating to Hertz resolution, require a large number of expensive analog and digital circuits. With microwave signal simulation, the addition of modulation performance features adds to the circuit complexity, size, weight and cost. An example would be the HP 8791 frequency signal simulator that weighs over three hundred pounds and costs over one hundred thousand dollars.

Direct Digital Frequency Synthesis (DDFS) is a known technique for generating a precisely-controlled, fast frequency switching, frequency accurate, radio frequency (RF) output. There presently exist various narrow band DDFS integrated circuits that provide frequency and phase control with fractional Hertz and radian resolution, with reasonable spurious performance (−60 decibels below carrier (dBC)). Narrow band DDFS has applications in signal simulation. However, the application is limited due to the inherent narrow RF output bandwidth. Wide-band DDFS integrated circuits exist that provide frequency control only, but these circuits have comparatively poor spurious performance (−30 dBC). However, their wide RF output bandwidth makes possible frequency conversion into the microwave frequency band, with significant improvement in frequency spurious with minimum loss in frequency switching performance.

Applying both wide and narrow band DDFS with conventional analog frequency conversion, provides improved frequency and phase performance over that possible from traditional microwave frequency sources. The result being increased performance and reliability with reduced size, weight, and cost.

SUMMARY OF THE INVENTION

It is the object of the present invention to combine both wide and narrow band DDFS integrated circuitry with direct analog microwave frequency synthesis to improve performance and reliability and to reduce size, weight, and cost of the traditional microwave signal simulator.

In accordance with the above objectives, the invention provides a method and apparatus for direct digital-to-analog microwave frequency signal synthesis. The method requires generating a minimum number of accurate low noise reference frequencies. The reference frequencies are used to drive the DDFS clock circuits and provide the local oscillator frequencies to up-convert the DDFS output into the microwave bands. The wide band DDFS output is first processed through an up-converter and frequency divider circuits to reduce the inherent DDFS spurious. The reduced spurious wide band DDFS output is then up-converted into the required microwave bands. The narrow band DDFS output inherently low in spurious is directly up-converted into the required microwave bands. Control logic circuits provide a parallel bit Instruction for the DDFS process and the microwave up-converters. The result is a precision, low noise microwave source controlled in both frequency and phase, with the ability to set frequency anywhere in the required microwave band in less than one microsecond.

The advantages and results of the invention are apparent from the following detailed description of the invention and from the accompanying drawings.

DETAILED DESCRIPTION OF THE PREFERRED EMBODIMENT

Figure 1:
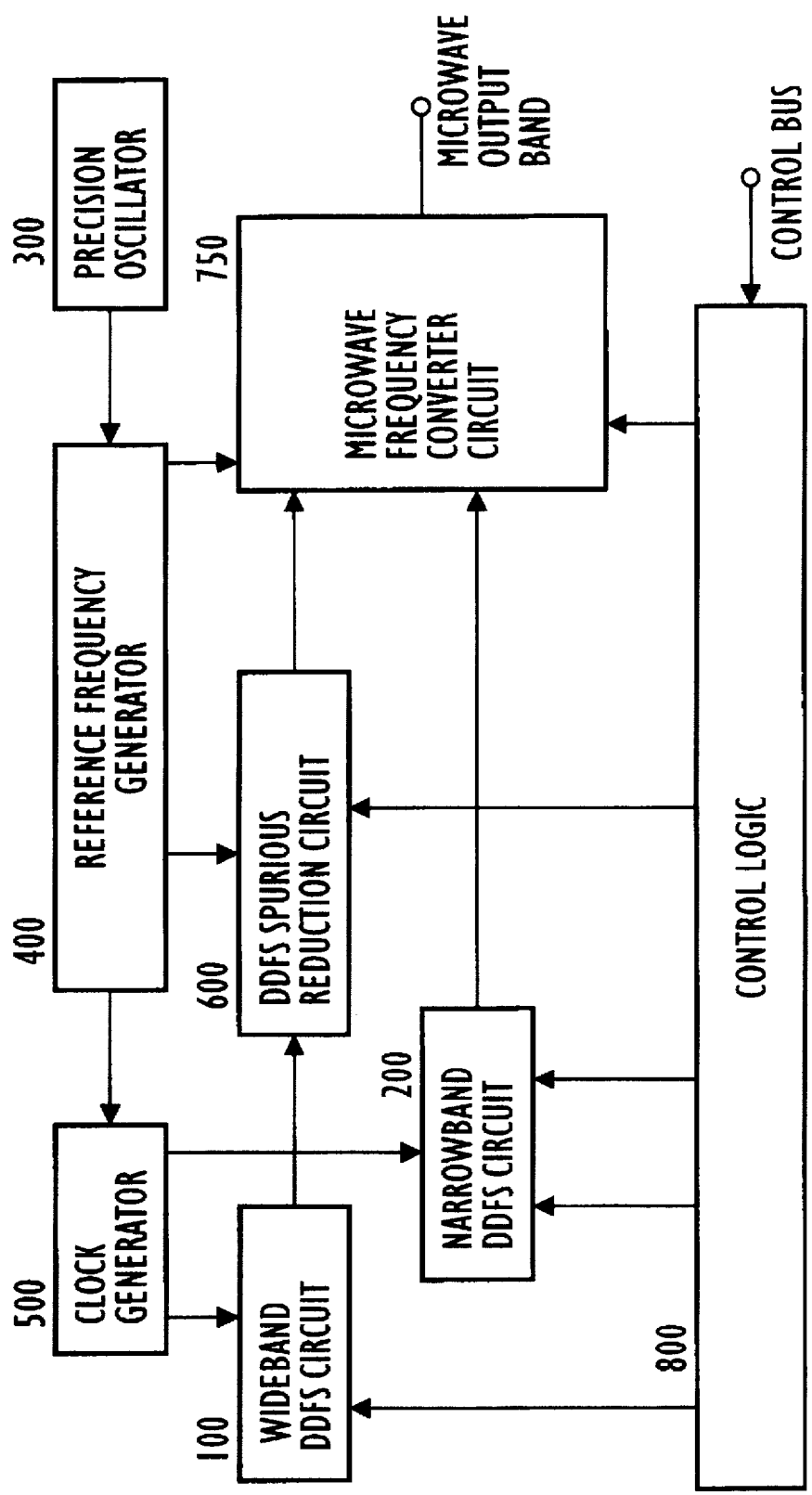
FIG. 1 is a top level block diagram of a direct digital-to-analog microwave frequency signal simulator according to the present invention.

FIG. 1 Is a top level block diagram of a direct digital to analog microwave frequency signal simulator according to the present invention. The direct digital to analog microwave signal simulator includes the following eight principal circuits:

1) Wide band direct digital frequency synthesis (DDFS) circuit 100.
2) Narrow band direct digital frequency synthesis (DDFS) circuit 200.
3) Precision oscillator. (External or internal) 300.
4) Reference frequency generator 400.
5) Clock generator 500.
6) DDFS spurious reduction circuit 600.
7) Microwave frequency converter circuit 750.
8) Control logic 800.

The precision oscillator 300 is a conventional reference oscillator that establishes the output microwave frequency accuracy and phase noise performance. Depending on the required overall performance, the precision oscillator would be either a temperature compensated crystal oscillator (TCCO), with a frequency accuracy of up to fout $\times 10^{-7}$, or for greater accuracy, an atomic standard crystal oscillator with a frequency accuracy of up to fout $10^{-12}$. The TCCO is preferred for low cost, size, and weight applications.

The phase noise performance of the precision oscillator 300 operating at less than 150 MHz is preferably a minimum of 150 dBc/H$_z$ at ±1 KH$_z$ off-set. Frequency accuracy and phase noise performance is maintained over an operating temperature environment of −55° C. to +85° C.

The reference frequency generator 400 is a conventional frequency multiplier circuit using either a non-linear device (e.g., a step recovery diode) or a phase and frequency locked oscillator circuit. The result is a range of discrete microwave frequencies as required for the overall direct digital-to-analog microwave frequency signal simulator configuration, generated with the accuracy and phase noise performance of the precision oscillator 300.

The clock generator 500 provides the clock frequencies (i.e., variable rate pulse train) for both the wide and narrow band DDFS integrated circuits as multiples of the precision oscillator 300 output frequency. If the required clock frequency is not an integer multiple of the precision oscillator output frequency, a third DDFS integrated circuit is required. An example would be for the wide or narrow band DDFS circuits to be required to generate an output frequency band with a decimal integer frequency resolution. As seen from the DDFS output frequency function from FIG. 2:

$$f_{out} = \frac{R_s F_{clk}}{R}$$

For fout to have a decimal integer resolution, set by Rs, the fclk must be a binary integer $2^N$. To generate the frequency $2^N$ requires the use of a third DDFS integrated circuit, clocked at an integer multiple of the precision oscillator frequency and set to approximately $2^N$ by the input word Rs. The error in the generated $2^N$ will be of no significance with large values for $2^R$ and Rs.

Figure 2:
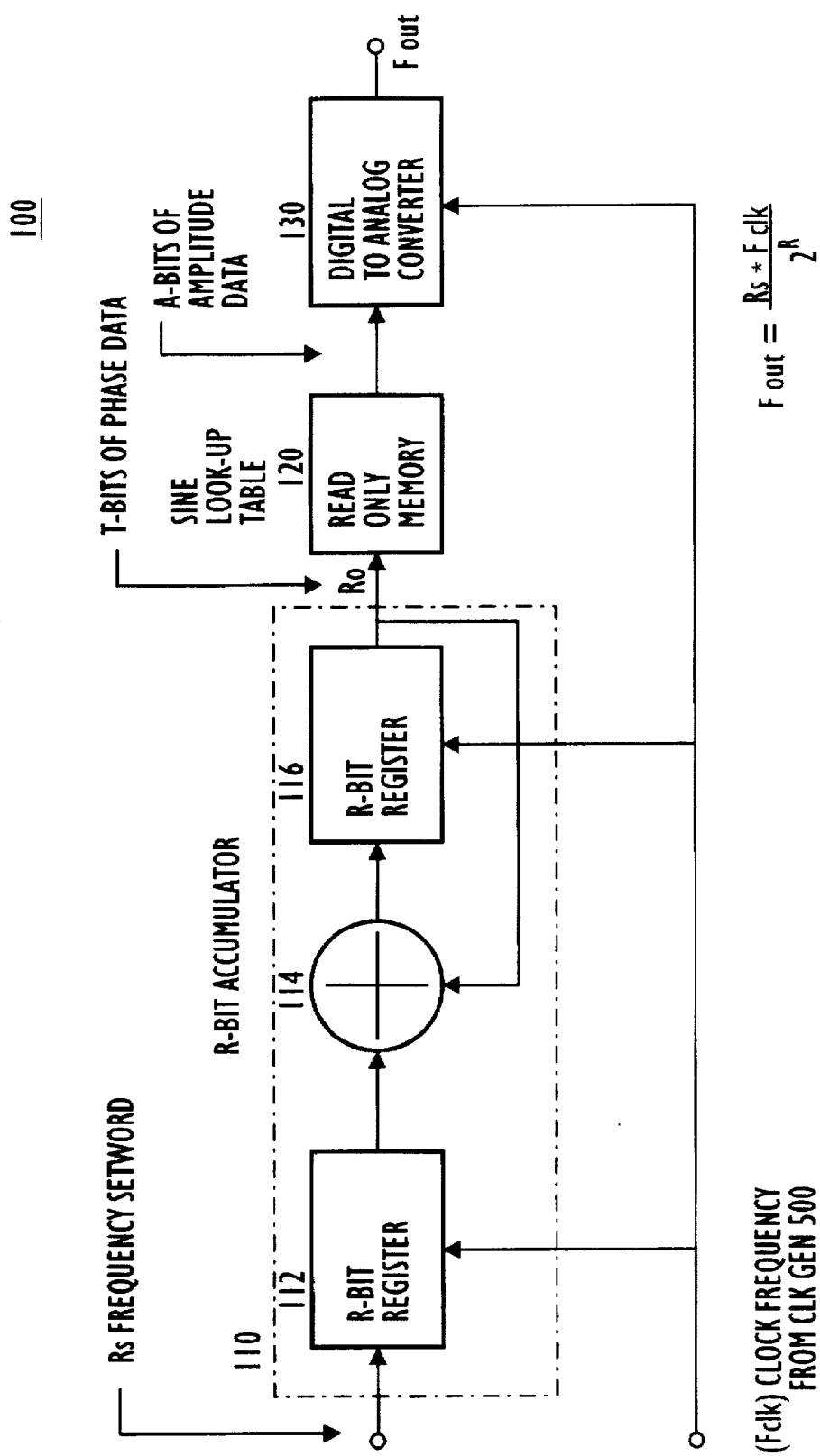
FIG. 2 is a more detailed block diagram of the wide band DDFS circuit 100 of FIG. 1.

The wide band DDFS integrated circuit 100 is detailed in the block diagram in FIG. 2. In operation, the parallel input word Rs sets the output frequency fout. The input word Rs is input through the first R-bit register 112, added to the output of the second R-bit register 116 through the adder 114, to provide a summed input to the second R-bit register 116. The result is an R-bit binary accumulator generating a binary word Ro, linearly increasing in increments of Rs at the clock frequency fclk rate. The binary word Ro is changing proportional to the change of phase of the set output frequency fout. The T-bits of phase data of the binary word Ro are used to address the read only memory 120. The read only memory 120 translates the address corresponding to discrete increments of phase data into discrete increments of amplitude data A of the sinewave fout. To complete the DDFS process, the amplitude data A is converted to the analog sinewave fout using the digital-to-analog converter 130. The output frequency fout being set by the following function from FIG. 2:

$$f_{out} = \frac{R_s F_{clk}}{2^R}$$

Figure 3:
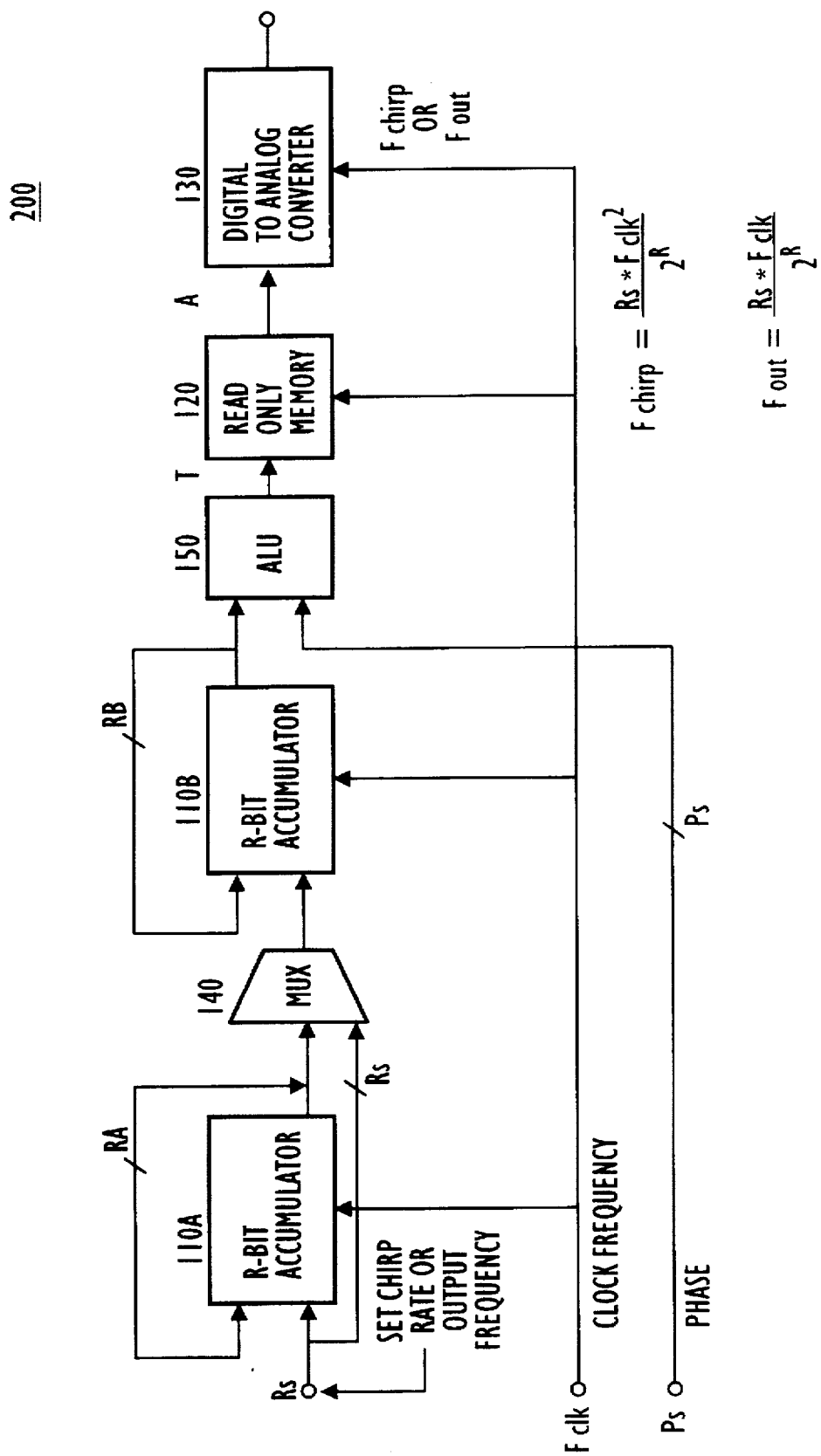
FIG. 3 is a more detailed block diagram of the narrow band DDFS circuit 200 of FIG. 1.

The narrow band 200 DDFS integrated circuit is detailed in the block diagram in FIG. 3. In operation, the input word Rs sets either the output frequency fout or the output frequency chirp rate Fchirp.

In the set output frequency mode, the input word Rs sets the output frequency fout. The input word Rs bypasses the first accumulator 110A with the use of the multiplexer 140. The circuit operation is similar to the wide band DDFS with the addition of an arithmetic logic unit (ALU) 150. The arithmetic logic unit allows the phase data RB from the accumulator 110B to be modified by the external binary word Ps. The result at the output of arithmetic logic unit 150 is an R-bit binary word changing proportional to the change of phase of the set output frequency fout, and adjustable in phase by an external binary word Ps. The phase adjustment provides control of the phase of the set output frequency fout to be phase coherent or phase set to the phase of an external frequency. The T-bits of phase data of the binary word, at the output of the arithmetic unit, are used to address the read only memory 120. The read only memory 120 translates the address corresponding to discrete increments of phase data into discrete increments of amplitude data A of the sinewave fout. To complete the DDFS process, the amplitude data A is converted to an analog sinewave using the digital-to-analog converter 130. The output frequency fout being set by the following function from FIG. 3:

$$f_{chirp} = \frac{R_s F_{clk}}{2^R}$$

In the set output frequency chip mode, the input word Rs sets the output frequency chirp rate Fchirp. The input word Rs is input to the first accumulator 110A. The first accumulator develops a binary word RA, increasing in discrete increments of Rs, representing the discrete frequency steps of the set frequency chirp. The frequency step word RA is input to the second accumulator 110B through the multiplexer 140. The second accumulator generates a binary word RB proportional to the change in phase of the discrete frequency steps of the set frequency chirp rate. The circuit operation is then the same as in the frequency set mode with the exception of the output frequency function. The output frequency chirp (fchirp) being set by the following function from FIG. 3:

$$f_{chirp} = \frac{R_s F_{clk}^2}{2^R}$$

The common method employed in both wide and narrow band DDFS integrated circuits 100 and 200 is a sample data process, where the clock frequency fclk is the sample function. The method develops an analog output frequency with a non-harmonic spurious frequency distribution that is unique to the DDFS output frequency fout and clock frequency fclk. Sample data spurious generated in this process, such as aliasing spurious, reduces the available spurious free bandwidth but is simply removed with a lowpass filter on the output of the DDFS circuit. In band spurious such as intermodulation products, caused by the digital-to-analog converter non-linearity and high out of band spurious, are not possible to remove by a filter on the output of the DDFS circuit. Removal of in band spurious is a challenge for all signal synthesis instruments, and is a common performance limitation of such devices.

Referring back to FIG. 1, the output analog set frequency fout from the wideband DDFS circuit 100 is supplied to a DDFS spurious reduction circuit 600 which reduces the non-harmonic frequency spurious amplitude by frequency up-converting, frequency dividing, frequency band compression and filtering. This DDFS spurious reduction circuit solves the long-felt need for in band spurious suppression for signal synthesis instruments.

Figure 4:
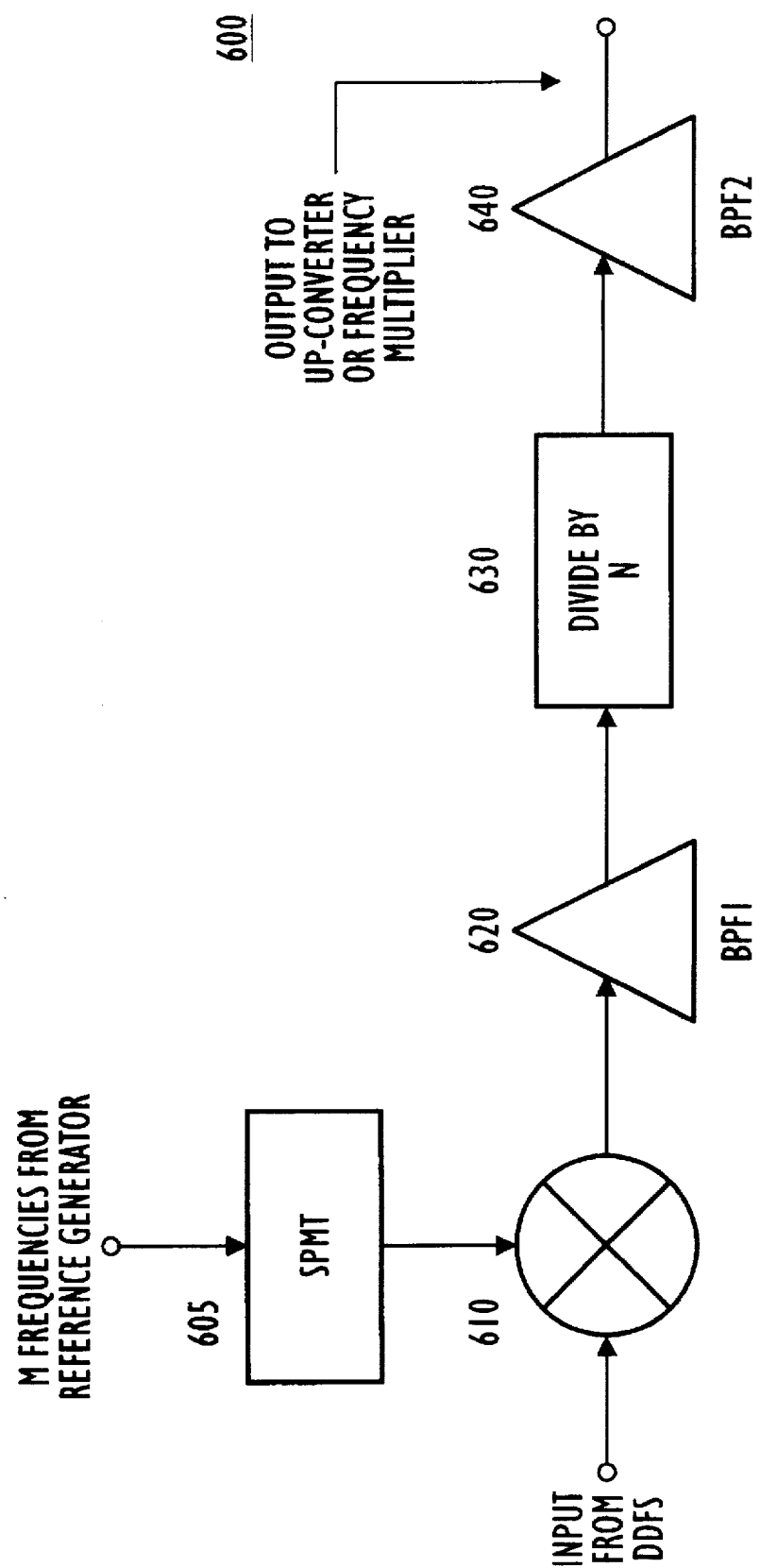
FIG. 4 is a detailed block diagram of the DDFS spurious reduction circuit 600 of FIG. 1.

FIG. 4 is a detailed block diagram of the DDFS spurious reduction circuit 600 of FIG. 1. Spurious reduction circuit 600 includes an up-converter circuit 610 connected to a bandpass filter 620, which is connected to a high frequency divide circuit 630, which in turn is connected to second bandpass filter 640.

The result is that the input frequency band fout supplied by the wide band DDFS circuit 100 to the DDFS spurious reduction circuit 600 is up-converted and frequency expanded using a fixed set of fixed frequencies generated by the reference frequency generator 400. The choice of individual frequency is chosen to, among other things, avoid accentuating the spurious inherent from the input from the DDFS. Each discrete spurious acting to angle modulate the carrier (e.g., frequency modulation). The upconversion and bandwith expansion operation will lower the sideband to carrier ratio in proportion (on a logarithmic scale) to modulation frequency. Remember that the sideband energy is due to spurious and noise components. Conversely, reducing the bandwidth will improve the carrier to sideband ratio, thereby enhancing the quality of the DDFS output.

The expanded DDFS bandwidth is Frequency division by the ratio N accomplished in the frequency divide circuit 630. As a result of frequency dividing, the amplitude of the non-harmonic frequency spurious, inherent in the wide band DDFS process, is reduced by the function 20 LOG (N) dB. The larger N, the larger the suppression. The expanded DDFS bandwidth is also frequency compressed by the divide ratio N while the frequency distribution of the non-harmonic spurious remains unaltered. Relative to the divided output frequency the output non-harmonic frequency spurious occupies a percentage bandwidth increased by the ratio N. The output bandpass filter PBF2 640 required to pass the compressed output frequency band has now the advantage to reject the frequency spurious, originally in band, occupying the increased percentage bandwidth. The advantage for spurious reduction, from the output filter BPF2 640, is only practical to where the filter group delay, does not compromise the frequency switching performance.

If additional suppression is required, multiple spurious reduction circuits 600 may be cascaded.

One example of how the processing flow for a given input frequency is provided below in reference to FIG. 4. An input signal provided by the DDFS is provided to mixer 610 through a single pole multi-throw switch (SPMT) 605. The bandwidth of the input signal occupying 924 MHz to 1144 MHz (i.e., 220 MHz). This input signal is then mixed in mixer 610 with four frequencies from a reference generator 400. These frequencies are appropriately selected by and routed through SPMT 605 and applied to the input signal in the following way. First, a local oscillator (L.O.) having with a frequency of 4840 MHz, is mixed with the input signal. The resulting output then occupies a frequency range between 3696 MHz and 3916 MHz. The input signal is then mixed a second time with a local oscillator at 5060 MHz. Note that this local oscillator has a difference frequency of 220 MHz, when compared with the first local oscillator, which is equivalent to the signal bandwith. Likewise, the resulting signal after this mixing operation results in a signal occupying the frequency range 3916 MHz to 4136 MHz; the total signal bandwidth then occupies the frequency range of 3696 MHz through 4136 MHz. The input signal is applied to two additional local oscillators in the same way. The third local oscillator has a frequency of 5280 MHz (i.e., a difference frequency of 220 when compared with the second L.O.) and the final frequency oscillator or local oscillator has a frequency of 5500 MHz (again a frequency difference of 220 MHz). The resulting bandwith at the output of mixer 610 is a signal having a bandwidth in the range of 3696 MHz to 4576 MHz. Thus, the output of the mixer 610 has a bandwidth four times the original signal bandwidth and then is shifted in frequency by a multiplicative factor of 4, (i.e., N). This expanded and upconverted signal is then passed through bandpass filter 620 which limits extraneous noise outside the intended bandwidth. The output of the bandpass filter 620 is then passed through a divide by N circuit 630. For this example, N =4 and preferentially N is an integer number that is a power of 2. However, other values of N could be used as well. (Binary dividers wherein N=2, 4, 8 or 16 are readily available in the commercial market. Typically, N=4 dividers are the most cost-effective for the purposes described herein.) The divide by N circuit 630 preferentially selects the energy in the upconverted and frequency expanded signal and restores it to its original bandwidth and center frequency. It is this step wherein the spurious that existed in the input DDFS are suppressed by 20 log N, or 12 dB since N=4. The resulting signal is then passed through another bandpass filter 640. The resulting output effectively contains the same input from the DDFS with reduced spurious and improved carrier to spurious ratio. It is important to note that this spurious reduction circuit can be used multiple times, or in series, in order to get further suppression of spurious as required. (A critical parameter is that the number of local oscillators should generally be equal to the N in the divide by N circuitry. Thus, if there are 4 LO's shown, the divide by N should be 4 as well. Furthermore, the difference between the LO's should be fixed and should correspond with the input signal bandwidth.)

The analysis for the DDFS non-harmonic spurious reduction using frequency dividing is as follows. For simplicity, a phase modulated frequency carrier modulated with a single sinusoid is assumed. The instantaneous magnitude of a phase modulated carrier is represented by the expression:

$$v = E\sin(2\pi f_c t) + M\sin 2\pi f_m t) \quad \text{(volts)}$$
$$\text{carrier} \quad \text{modulation}$$

where the modulation index $M \ll 1$.

The instantaneous phase of the modulated carrier is represented by the expression:

$$\beta = 2\pi f_c t + M \sin 2\pi f_m t \text{(radians)}$$

and the instantaneous frequency of the modulated carrier is represented by the expression:

$$f = \frac{1}{2\pi} * \frac{dB}{dt} \quad \text{(Hertz)}$$

then $$f = f_c + M f_m (\cos 2\pi f_m t)$$

where the peak deviation $\Delta f$ is:

$$\Delta f = M f_m \text{(Hertz)}$$

and the modulation M index is:

$$M = \frac{\Delta f}{f_m} \quad \text{(radians)}$$

Frequency multiplying (doubling) a phase modulated carrier is represented by the expression:

$$v^2 = \left[ E\sin\left( 2\pi f_c t + \frac{\Delta f}{f_m} \sin 2\pi f_m t \right) \right]^2$$

and by comparison to:

$$(\sin A)^2 = \frac{1}{2}(1 + \sin 2A)$$

where $$A = 2\pi f_c t + \frac{\Delta f}{f_m} \sin 2\pi f_m t$$

At the second harmonic the peak deviation of the phase modulated carrier has doubled.

For frequency multiplying at the $n^{th}$ harmonic, the peak deviation will be:

$$n * \Delta f \text{(radians)}$$

For frequency dividing at the $n_{th}$ sub-harmonic, the peak deviation will be:

$$\frac{1}{n} * \Delta f \quad \text{(radians)}$$

The Bessel-function series expansion of the instantaneous frequency expression for a phase modulated carrier:

$$f = fc + Mf_m(\cos 2\pi f_m t)$$

with a modulation index $M \ll 1$ identifies the components of the modulated carrier of any significance as being:

fc the carrier;

fc+fm the upper sideband;

fc−fm the lower sideband;

and the ratio of the power in each sideband relative to the power in the carrier is represented as follows:

$$\frac{V_{sideband}}{E_{carrier}} = \frac{20 * \log_{10}[m]}{2} \quad (dB)$$

The side band to carrier power expression illustrates that as the carrier frequency is divided by n then the spurious to carrier power ratio is reduced by:

$$20 * \text{Log}_{10}[n](dB)$$

Referring back to FIG. 1, the output from either the wideband DDFS circuit 100 or the narrowband DDFS circuit 200 is enabled by control logic 800 and switched to the microwave frequency converter circuit 750. The microwave frequency converter circuit 750 operates as a conventional frequency band expander and frequency up-converter. The input is selected from either the wideband DDFS spurious reduction circuit 600 or the narrowband DDFS circuit. The band expansion and frequency conversion is accomplished using a range of fixed frequencies generated by the reference frequency generator 400, referenced to the precision oscillator 300. The frequency band expansion and frequency conversion circuits provide for frequency band overlaps to meet the required frequency chirp, phase control performance.

Having now fully set forth a detailed example and certain modifications incorporating the concept underlying the present invention, various other modifications will obviously occur to those skilled in the art upon becoming familiar with said underlying concept. It is to be understood, therefore, that within the scope of the appended claims, the invention may be practiced otherwise than as specifically set forth herein.

We claim:

1. An apparatus for direct digital-to-analog microwave for narrowband and wideband suppressed spurious frequency signal synthesis, comprising:

an oscillator for generating a fixed frequency output selected from a range of discrete frequencies;

a reference frequency generator connected to said oscillator for stabilizing the fixed frequency output;

a clock generator connected to said reference frequency generator for producing a clock output with a precise frequency governed by the reference frequency generator;

a wideband direct digital frequency synthesizer (DDFS) circuit connected to said clock generator for providing fast frequency switching output;

a narrowband DDFS circuit connected to said clock generator for providing a frequency chirp, phase controlled output;

a control logic circuit connected to both the wideband DDFS circuit and narrowband DDFS circuit to selectively enable the wideband DDFS circuit and narrowband DDFS circuit and thereby select from a pair of DDFS frequency outputs output respectively from said narrowband DDFS circuit and said wideband DDFS circuit;

a DDFS spurious reduction circuit connected to said wideband DDFS circuit for reducing spurious response of said frequency output; and a microwave frequency converter circuit for expanding the frequency band and up-converting one of said selected DDFS frequency outputs to provide a synthesized microwave output signal therefrom.

2. The apparatus of claim 1, wherein said DDFS spurious reduction circuit comprises:

frequency generating means for providing multiple discrete frequencies;

upconversion and frequency expansion means, said upconversion and frequency expansion means accepting said multiple discrete frequencies for upconverting and expanding said input from said DDFS;

bandlimititing means for suppressing out of band harmonics and other out of band spurious from output of said upconversion and frequency expansion means, said bandlimiting means having an output;

frequency reduction means for bandlimiting said output of said bandlimiting means, said frequency reduction means selectively suppressing in band spurious, said frequency reduction means having an output; and bandpass filtering means for accepting said output of said frequency reduction means and limiting extraneous out of band energy thereon.

3. The apparatus of claim 2, wherein said frequency reduction means constitutes a divide by N filter.

4. The apparatus of claim 3, wherein said frequency reduction means preferentially suppresses said in band spurious by 20 Log (N).

5. A method for direct digital-to-analog microwave frequency signal synthesis, comprising the steps of:

generating a clock output with a precise stabilized frequency;

outputting said clock output to a wide band direct digital frequency synthesizer (DDFS) circuit and to a narrow band DDFS circuit;

enabling selectively either said wide band DDFS circuit to provide a fast frequency switching output, or to said narrowband DDFS circuit to provide a frequency chirp, phase controlled output;

reducing in band spurious response of said enabled wide band DDFS circuit; and microwave frequency converting the selected DDFS circuit frequency output respectively from said wide band DDFS circuit and said narrowband DDFS circuit to provide a synthesized microwave output signal therefrom.

6. The method for direct digital-to-analog microwave frequency signal synthesis of claim 5, wherein said step of reducing in band spurious response of said enabled wide band DDFS circuit comprises the steps of:
  up converting an input from a DDFS thereby creating a signal;
  frequency expanding said signal;
  limiting the band width of said signal;
  dividing by N said signal; and
  limiting the band width of said signal to create an output signal, said output signal having suppressed in band spurious.

* * * * *